United States Patent [19]

Skrtic

[11] Patent Number: 5,199,564

[45] Date of Patent: Apr. 6, 1993

[54] CARRIER TAPE FOR ELECTRONIC THROUGH-HOLE COMPONENTS

[75] Inventor: Thomas Skrtic, Eau Claire, Wis.

[73] Assignee: Minnesota Mining and Manufacturing Company, St. Paul, Minn.

[21] Appl. No.: 851,420

[22] Filed: Mar. 13, 1992

[51] Int. Cl.⁵ ............................................. B65D 73/02
[52] U.S. Cl. ................................... 206/330; 206/331; 206/332
[58] Field of Search .............................. 206/328–334, 206/389, 820

[56] References Cited

U.S. PATENT DOCUMENTS

| | | | |
|---|---|---|---|
| 4,583,641 | 4/1986 | Gelzer | 206/330 |
| 4,757,895 | 7/1988 | Gelzer | 206/330 |
| 4,781,953 | 11/1988 | Ball | 206/328 |
| 4,852,737 | 8/1989 | Noll | 206/330 |
| 4,898,275 | 2/1990 | Skrtic et al. | 206/330 |
| 4,966,281 | 10/1990 | Kawanishi et al. | 206/330 |
| 5,033,615 | 7/1991 | Shima et al. | 206/328 |
| 5,152,393 | 10/1992 | Chenoweth | 206/331 |

*Primary Examiner*—Jimmy G. Foster
*Attorney, Agent, or Firm*—Gary L. Griswold; Walter N. Kirn; Peter L. Olson

[57] ABSTRACT

The present invention relates to a carrier tape for supplying electronic through-hole components seriatim to a machine. In one embodiment, the tape includes a plurality of aligned pockets each including two parallel rows of aligned apertures formed in the bottom wall portion of each pocket and adapted to grip the pins of the electronic components inserted therein to retain the components within the pockets.

30 Claims, 4 Drawing Sheets

CARRIER TAPE FOR ELECTRONIC THROUGH-HOLE COMPONENTS

TECHNICAL FIELD

This invention relates to a carrier tape for storing electronic components and for supplying those components seriatim to a machine.

BACKGROUND OF THE INVENTION

Figure 1:
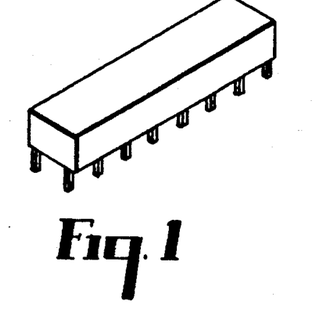
FIGS. 1 and 2 are perspective views of conventional through-hole components.
Figure 2:
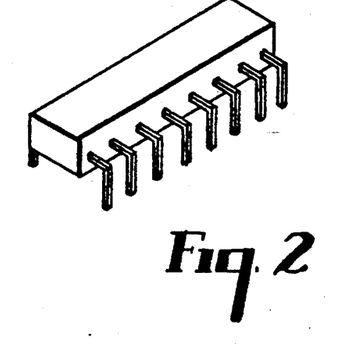
Figure 3:
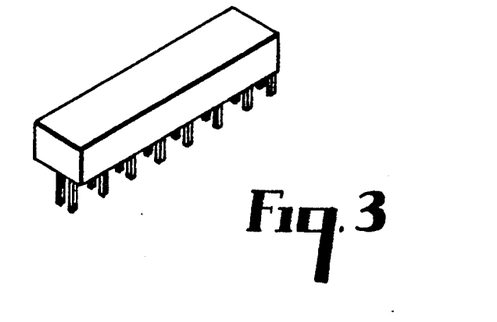
FIG. 3 is a perspective view of an angled through-hole connector.

In the field of electronic circuit assembly, electronic components are often carried from a supply of such components to a specific location on a circuit board for attachment thereto. The components may be of several different types, one group of which is known as through-hole components. Through-hole components include a body having a plurality of pins projecting therefrom, which are adapted to be inserted through a matching number of apertures on a printed circuit board and soldered on the reverse side of the circuit board to electrically connect and secure the component to the circuit board. The pins of the through-hole component, which are generally formed in at least two aligned rows, project either downwardly from the bottom portion of the body, as shown by the component in FIG. 1 and the angled connector in FIG. 3, or outwardly from the side portions of the body for a first distance and then downwardly for a second distance, as illustrated by the component shown in FIG. 2. Examples of through-hole components include memory chips, resistors, connectors, dual in-line processors (DIPS), and gate arrays. Common to each type of through-hole component are the downwardly projecting terminal ends of the pins, which are adapted to be inserted through the aligned apertures of a printed circuit board.

Rather than manually installing and soldering each individual through-hole component to a circuit board, the electronics industry makes extensive use of robotic placement machines, which grasp a component at a specific location (the supply) and place it at another specific location (the circuit board) with the pins of the component through the apertures in the printed circuit board. Such machines may also be known as insertion machines, because the machine inserts the pins of the component through the apertures in the printed circuit board, where the pins are soldered to the board. To ensure the sustained operation of such robotic placement machines, a continuous supply of electronic components must be furnished to the machine at a predetermined location, in order that the robotic placement machine may be programmed to repeat a precise sequence of movements during every cycle. It is therefore important that each such component be located in the same position (i.e. the point at which the robotic placement machine grasps the component) as each preceding and succeeding component.

Figure 4:
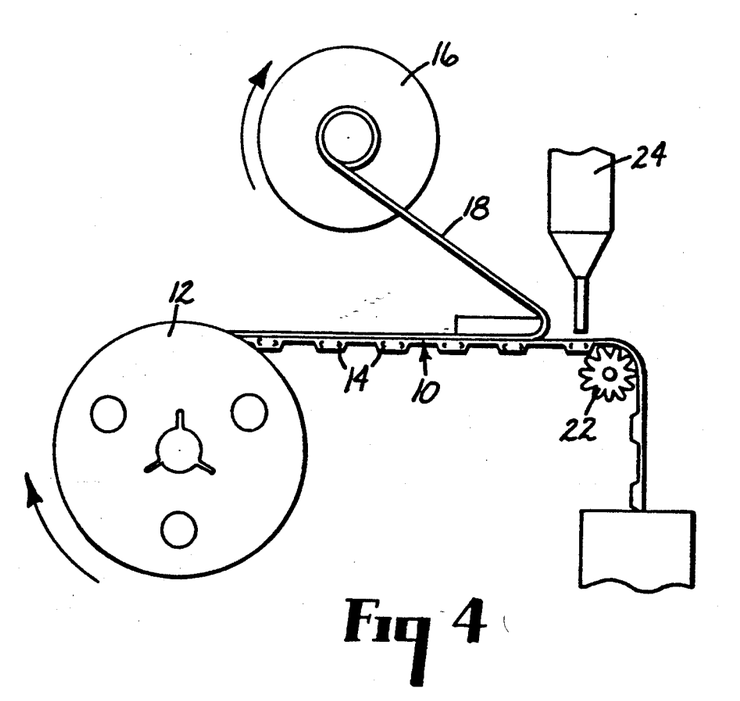
FIG. 4 is a schematic representation of a carrier tape being supplied to a robotic placement machine.
Figure 5:
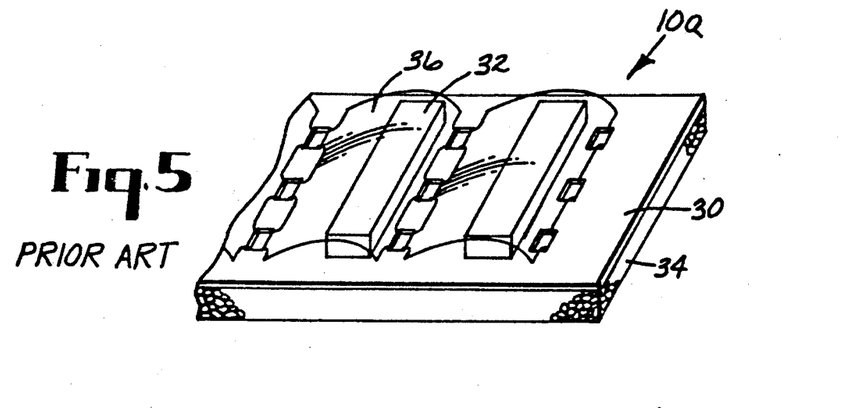
FIG. 5 is a perspective view of a carrier tape of the prior art.
Figure 6:
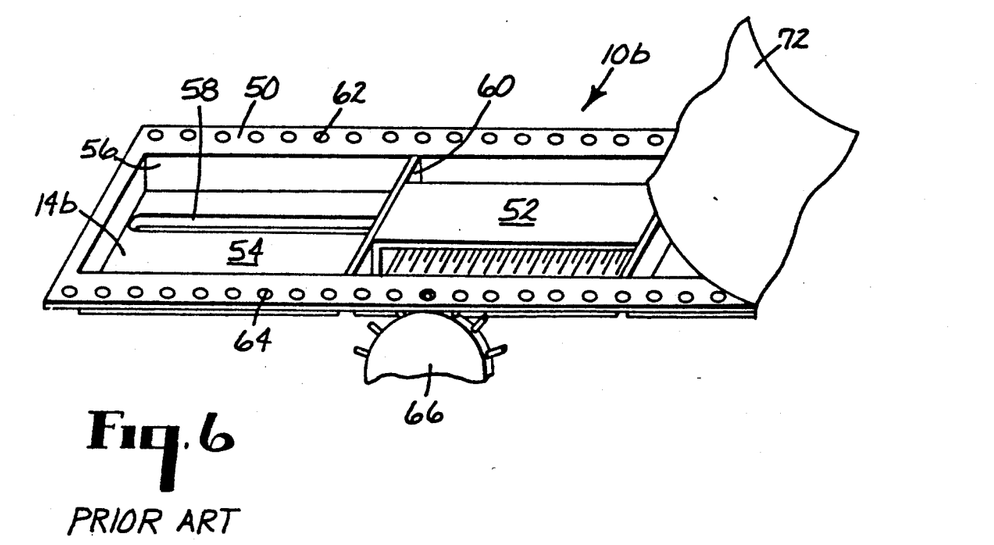
FIG. 6 is a perspective view of a carrier tape of the prior art.

One way to provide a continuous supply of electronic components to a desired location is to attach a series of such components at constant intervals to a length of carrier tape. The loaded carrier tape, which is usually provided in roll form, may then be advanced toward the pick-up location at a predetermined rate as each succeeding component is removed from the tape by the robotic placement machine. For example, conventional carrier tape 10 is shown in combination with robotic placement machine 24 in FIG. 4. Supply roll 12 provides carrier tape 10 having an aligned plurality of regularly spaced pockets 14, each of which is loaded with a component (not shown). As shown in FIGS. 5 and 6, conventional carrier tapes generally comprise a lower portion that carries the component, and a flexible cover strip. The cover strip aids in preventing foreign matter from deleteriously affecting the component, and may engage the lower portion periodically, as shown in FIG. 5, or be releasably bonded to the lower portion, (e.g. thermally, ultrasonically or adhesively), as shown in FIG. 6. The cover strip is peeled away from the lower portion just before the robotic placement machine removes the component from the carrier tape.

Referring again to FIG. 4, stripper assembly 16 peels cover strip 18 from the carrier tape around stripper block 20, which block assists in preventing stripper assembly 16 from pulling carrier tape 10 away from its designated path. Carrier tape 10 is advanced by sprocket 22, which engages advancement holes along at least one outer edge of carrier tape 10 to advance carrier tape toward robotic placement machine 24. As each successive component reaches the desired pick-up point, the robotic placement machine grasps the component (either manually or by suction) and places it on a circuit board with the pins of the component inserted through apertures in the circuit board.

An example of a conventional carrier tape for through-hole components is shown in FIG. 5, and is generally similar in design to the carrier tapes shown in U.S Pat. Nos. 4,583,641 (Gelzer) and 4,757,895 (Gelzer). Carrier tape 10a includes substrate 30 including a plurality of holes into which the pins of through-hole component 32 are inserted, usually manually. The pins project beyond substrate 30, and it is therefore desirable to protect the pins from damage. The pins are pressed into and protected by a foam cushion layer 34, which is generally the same width and length as substrate 30, and is thicker than the length of the pins. Cover strip 36 is periodically attached to substrate 30, and assists in protecting through-hole components 32 prior to use. An aligned row of advancement holes formed in substrate 30 is adapted to receive drive sprockets of an advancement mechanism for advancing the carrier tape toward a desired location.

While having its own utility, the carrier tape shown in FIG. 5 may be undesirable because it is typically assembled by hand, which is slow and expensive because it usually requires an extensive commitment of human resources for large scale operations. The substrate, cushion layer, and cover strip configuration is also relatively difficult to assemble, and the use of such packaging is expensive and considered by some to be wasteful. Furthermore, the component is not in a sealed area, and as a result the component is susceptible to dust and other airborne contaminants. The illustrated carrier tape may not include any anti-static capability, and an electrical charge that is applied to the carrier tape may be conducted directly to the component, which may damage the component. Finally, the carrier tape shown in FIG. 5 does not protect the through-hole components mounted thereon from the application of significant pressure to the top of the component. For example, a loaded carrier tape is typically stored and transported in roll form, and the through-hole components carried by the carrier tape described above and located near the core of the roll could be subjected to compressive forces that would damage the components. Similarly, the through-hole components at the outer periphery of the roll could be subjected to impact that would damage the components.

Another type of carrier tape is shown in FIG. 6, and is available from Minnesota Mining and Manufacturing Company of St. Paul, Minn. Carrier tape 10b is a molded polymeric material that includes a strip portion 50 in which a series of pockets 14b have been formed to carry through-hole components 52. Each pocket includes a bottom wall 54 and four side walls 56, and bottom wall 54 further includes channel 58, which is adapted to surround the pins (not shown) projecting from the underside of the through-hole component. Dividers 60 separate adjacent through-hole components, and assist in positioning components 52 within pockets 14b. Strip portion 50 includes two parallel rows of advancement holes 62 and 64, which are dimensioned to be engaged by the teeth of sprocket 66 to convey the carrier tape in direction 70. A cover tape 72, which is releasably bonded to strip portion 50, aids in protecting the through-hole components 52 from airborne contaminants prior to use.

The carrier tape shown in FIG. 6, while overcoming some of the deficiencies of the carrier tape referenced above, also includes some undesirable features. For example, each through-hole component is free to rattle within the confines of pocket 14b, which could damage the pins of the component, or the component itself. The carrier tape also does not organize the through-hole components in the most space efficient manner, which wastes packaging materials.

Most importantly, carrier tapes generally, and the illustrated carrier tape in particular are not intended to convey through-hole components of different sizes. For through-hole components that are larger than those that the pocket would usually contain, the pocket would be too small, which would require a component packager to stock carrier tapes having larger pockets than that packager would normally use. This could require that the packager maintain an increased inventory and incur the concomitant costs thereof. When smaller through-hole components are conveyed on a carrier tape that would normally carry larger components, the smaller components could rattle within the pocket, which could damage the pins of the component. Furthermore, if the component is small enough, any significant displacement would prevent the robotic placement machine from locating and grasping the component because the component would not be presented at the precise location that is required for effective operation of the robotic placement machine. For example, the Electronic Industries Association restricts the maximum allowable rotation of a component in a carrier tape cavity to no more than 20° with respect to the carrier tape, and a relatively slight displacement of a small component could result in an angular rotation that exceeds the limit established by the E.I.A. The carrier tape described above, which may tend to permit translational or rotational movement of smaller components, is thus disadvantageous because it may not present each component in the same location as the previous component.

In view of the disadvantages of the carrier tapes of the prior art, it is therefore desirable to provide a carrier tape for through-hole components that protects the components it conveys, is inexpensive and space efficient, and that can be easily adapted to convey different types and sizes of through-hole components.

SUMMARY OF THE INVENTION

According to the present invention there is provided a unitary flexible carrier tape for storage and seriatim delivery of electronic through-hole components by an advancement mechanism. Each component has a body having a plurality of pins projecting from the body and arranged in two parallel rows. The carrier tape includes a strip portion defining a top surface, the strip portion including laterally spaced, parallel rows of aligned holes formed in the top surface for engagement with the advancement mechanism, and a plurality of aligned pockets spaced along the carrier tape and opening through the top surface. The pockets each include four side wall portions each at generally right angles with respect to each adjacent wall portion, the side wall portions adjoining and extending downwardly from the top surface of the strip portion, and a bottom wall portion adjoining the side wall portions to form the pocket. The bottom wall portion has two parallel rows of aligned apertures formed therein, which are adapted for receipt of and engagement with each of the pins of the components, the rows having at least as many apertures as the component has pins, and two spaced rib portions formed in the bottom wall and projecting away from the strip portion for a distance greater than the length of the pins to protect the pins of the component.

In another embodiment, the present invention also provides for a carrier tape as generally described above, but having a plurality of arranged apertures formed in the base wall portion, which are adapted to retain the pins of a through-hole component having an arranged plurality of pins. Also provided is a carrier tape having through-hole components stored in the pockets, as well as a carrier tape having through-hole components stored in the pockets and the carrier tape rolled about a core to form a roll.

Other embodiments of the carrier tape of the present invention include a carrier tape having pockets adapted to carry more than one component in each pocket, a carrier tape having a plurality of rows of pockets, a carrier tape having a cover strip, and a carrier tape that is electrically dissipative.

BRIEF DESCRIPTION OF THE DRAWINGS

The invention will be more readily understood with reference to the accompanying drawings, wherein like reference numerals refer to like components throughout the several views, and wherein.

DETAILED DESCRIPTION

The present invention relates broadly to a carrier tape having a plurality of pockets formed therein, each of which includes an array of apertures formed in the bottom wall thereof to retain the pins of through-hole components positioned therein. Through-hole components refer broadly to electronic components having a body including a plurality of aligned pins having downwardly projecting terminal ends which are adapted to be inserted through the apertures of a printed circuit board. Although the term "through-hole component" will be used herein to refer primarily to components that are later connected to a circuit board, it should be understood that any articles having projecting leads, pins, wires, or the like (e.g. small light bulbs, thermocouples, male plug members, and thermistors) are also contemplated. Similarly, although the through-hole components described herein typically include a plurality of aligned pins that include downwardly projecting terminal ends, components having pins including terminal ends that project substantially downwardly are also included within the scope of the present invention.

Figure 7:
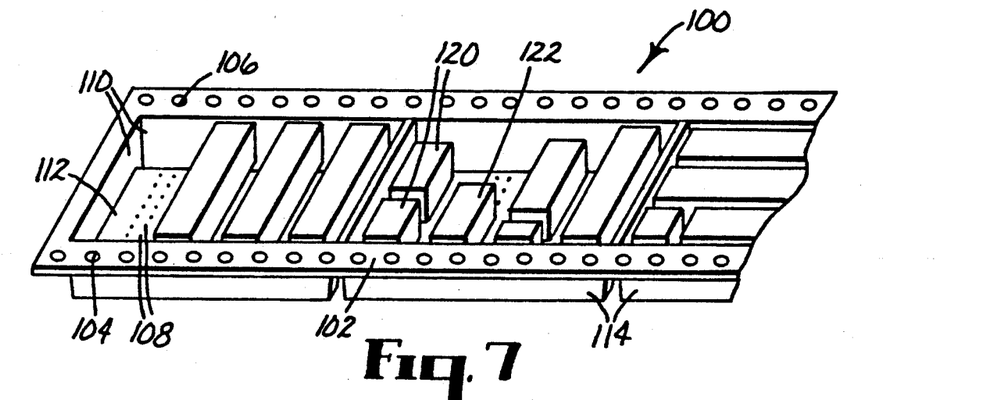
FIG. 7 is a perspective view of one embodiment of a carrier tape according to the present invention.

Referring specifically to FIG. 7, there is shown a unitary flexible carrier tape 100, which is generally self-supporting, having a strip portion 102 defining a top surface. Strip portion 102 includes at least one, and preferably two rows of aligned advancement holes 104 and 106 formed therein, which holes are adapted for engagement with an advancement mechanism (shown with respect to the prior art in FIG. 6). The advancement mechanism typically comprises one sprocket for each row of advancement holes, and the teeth of each sprocket engage the holes to advance the carrier tape toward a predetermined point, at which point the robotic placement machine may grasp the individual through-hole components seriatim. The holes and the spacing between adjacent holes may also be varied to accommodate different types of advancement mechanisms. In one embodiment, the holes measure on the order of 1.55 mm (0.061") in diameter and are regularly spaced at a distance of approximately 4 mm. (0.16") on center.

Figure 8:
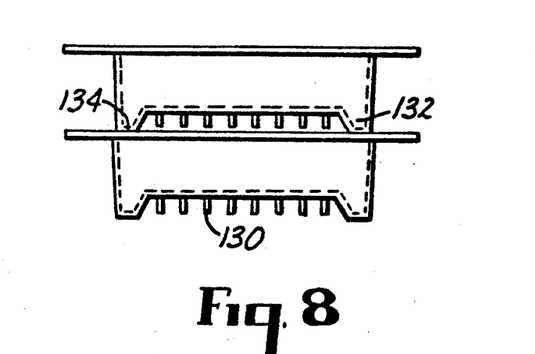
FIG. 8 is a sectional view of two stacked layers of the carrier tape of the present invention.
Figure 9:
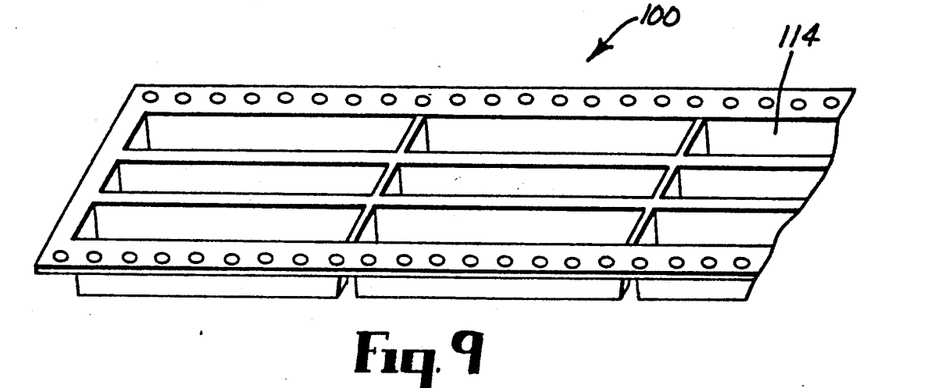
FIG. 9 is a perspective view of a second embodiment of a carrier tape according to the present invention.

Pockets 114 are formed in and spaced along strip portion 102 in one or more aligned rows, as shown in FIGS. 7 and 9. In the illustrated embodiments, each pocket includes four side wall portions 110 each at generally right angles with respect to each adjacent wall portion. Side wall portions 110 join and extend downwardly from the top surface of the strip portion, and join bottom wall portion 112 to form pocket 114. Each wall portion may also be formed with a slight draft (i.e. a 2° to 12° slant toward the center of the pocket) in order to help prevent stacked layers of empty carrier tape from nesting together, which may make separation of adjacent layers difficult. It is also within the range of equivalents of the present invention to provide a pocket having more or less wall portions than the four that are shown with reference to the preferred embodiment (e.g. a circular pocket having only one wall portion, or a triangular pocket having three wall portions). Bottom wall portion 112 is generally planar, and parallel to the plane of strip portion 102, and includes one or more rib portions extending from the bottom of pocket 114 to protect the pins of the component, as shown in FIG. 8 and described hereinbelow. In the preferred embodiment, the pocket is designed to conform to the profile of the component, in order to position the component more precisely within the pocket.

Figure 10:
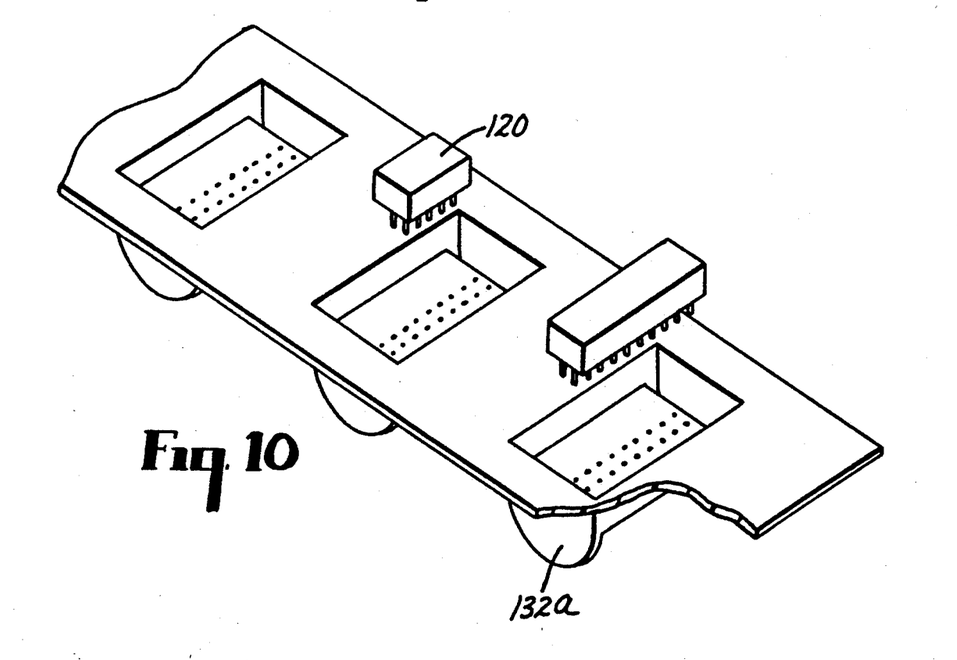
FIG. 10 is a perspective view of a third embodiment of a carrier tape according to the present invention.

As shown generally in FIG. 9, pockets 114 may be formed in more than one row that extends longitudinally of carrier tape 100'. Although FIG. 9 illustrates each pocket oriented parallel to the longitudinal axis of the tape, pockets 114 could also be oriented transverse to the longitudinal axis of the tape, as shown generally in FIG. 10. Additionally, FIG. 10 illustrates a single row of pockets extending along the length of the tape, but it is within the scope of the present invention to provide more than one row of pockets along the length of the tape. It is believed that a carrier tape including pockets having a longitudinal axis that extends transverse to the longitudinal axis of the tape may be more effectively rolled about a core to form a roll for storage and shipment, without bending of or damage to the pockets.

The electronic through-hole components are maintained in position within pockets 114 by insertion of each pin through an aperture, which apertures 108 are formed in bottom wall portion 112. Although apertures of many different sizes and patterns may be formed, they are shown in the illustrated embodiment as two parallel rows of aligned apertures. It should be understood, however, that the apertures could instead be organized in any other pattern, or may comprise just one aperture, depending on the through-hole component to be carried by the carrier tape. Additionally, some components include one or more post members, shown at 1 in FIG. 1, that extend downwardly from the component body, and are adapted to be retained within a hole of a circuit board after the circuit board is assembled. Apertures 108 of the present invention may also be sized and positioned to receive post member 1 in the aperture, to further assist in retaining the component within the pocket.

The number of apertures in each pocket is preferably equal to or greater than the number of pins of the largest through-hole component that is to be conveyed. As shown in FIG. 7, apertures 108 are preferably arranged in two parallel aligned rows, for retaining the pins of one or more through-hole components having two parallel rows of pins. By providing a number of apertures that is equal to or greater than the number of pins of the largest component to be carried, two advantageous features of the present invention are provided. First, components having an array of fewer pins, which pins are sized and spaced similar to those of the larger components for which the carrier tape was designed, may be carried within the pocket. Each component may be centered within the pocket, or each may be offset toward one side of carrier tape 100, as shown at 122. This allows a single size of carrier tape to be stocked and used by electronic component packagers for a variety of sizes of through-hole components, thereby reducing the need for stocking a different size carrier tape for each size of component.

A second advantageous feature is that multiple components may be conveyed within a single pocket, so long as each component has pins that are sized and spaced to match the size and pattern of the apertures. For example, two or more of through-hole components may be conveyed in adjacent relationship, as shown at 120 in FIG. 7. If carrier tape 100 includes more than one row of aligned pockets, as shown in FIG. 9, each pocket may carry two or more components as well, depending on the dimensions of the carrier tape and of the components.

In the preferred embodiment, means are provided for mechanically engaging pins 130 when they are disposed within apertures 108, in order to prevent accidental removal of the pins from the apertures. Engaging means preferably comprises slightly undersizing apertures 108 to induce mechanical engagement between the pin and the wall of the aperture. In this embodiment, the apertures should not be undersized to the point where pins may be bent during insertion into the apertures, but a pin measuring 0.76 mm (0.030") in diameter has been retained by an aperture measuring 0.75 mm (0.0295") without significant difficulty during insertion. The engaging means could also comprise forming apertures 108 so as to leave a burr attached to the aperture, which burr would tend to mechanically engage the pins of the through-hole component, as well as other means known in the art.

In the preferred embodiment, the rows of pockets and the rows of apertures within each pocket are oriented generally perpendicularly to the longitudinal direction of the tape, as shown in FIG. 7. This orientation permits space-efficient placement of a plurality of through-hole components within a single pocket, and may also facilitate coiling the loaded carrier tape about a core to form a roll. In another embodiment, the rows of pockets and the rows of aligned apertures within each pocket are oriented generally parallel to the longitudinal direction of the carrier tape, as shown in FIG. 9.

Bottom wall portion 112 also includes two spaced rib portions 132 and 134 formed therein and projecting downwardly, as shown in FIG. 8. The desired height of rib portions 132 and 134 depends upon the length of the through-hole component pins, and should generally be of a height greater than the length of the pins to protect the pins from damage during shipping and storage. The carrier tape may be provided in roll form, which presents successive layers in stacked relationship as shown in FIG. 8. Rib portions 132 and 134 distance pins 130 from the carrier tape layer below, and thereby reduce or prevent the risk of damage due to contact with adjacent layers. The rib portions could be combined into one rib portion, or could include several spaced rib portions that act as legs to maintain a space between the pins and any generally planar surface below the pins, such as another layer of the carrier tape. Another possible configuration is shown in FIG. 10, which includes two half-disk shaped rib portions 132a that protect the pins of through-hole component 120, which may also facilitate coiling the loaded carrier tape about a core to form a roll.

In general, the carrier tape of the present invention is made by thermoforming pockets in a sheet of polymeric material, forming advancement holes and apertures in the carrier tape by punching, and winding the carrier tape onto a core to form a roll, as shown schematically in FIG. 11 and described further hereinafter. A polymeric sheet 200 is provided, which polymeric sheet may be made from many different materials including, but not limited to polyester, polycarbonate, polypropylene, styrene, PVC (polyvinylchloride), ABS (acrylonitrile-butadiene-styrene copolymers) copolymers, and the like. In the preferred embodiment, polymeric sheet 200 is electrically dissipative, and includes an electrically conductive material, such as carbon black, which is either interspersed within the material comprising the polymeric sheet, or is coated on the carrier tape after the tape is formed. The electrically conductive material allows an applied electric charge to dissipate throughout the carrier tape and preferably to the ground. This feature may prevent damage to the components contained within the carrier tape due to an applied static electric charge.

Polymeric sheet 200 is provided, either in roll form, sheet form, by continuous injection molding, or by extrusion, and conveyed to heating means 202, where polymeric sheet 200 is heated sufficiently to permit thermoforming. The temperature to which the polymeric sheet must be heated varies over a broad range (i.e. 200°-370° F.) depending on the gauge and type of material that is being thermoformed.

Following heating, the sheet member is thermoformed by a die or dies 204 that shape the pocket to conform to the maximum size of the through-hole component to be carried therein. The die may be opposed male and female dies 204 that stamp the sheet material to mold the pockets. The carrier tape pockets could also be formed by vacuum forming the heated sheet material over a male die or into a female die, or by other molding means known in the art. The carrier tape is typically cooled after thermoforming, which can be accomplished by air cooling until the polymeric material solidifies.

Figure 11:
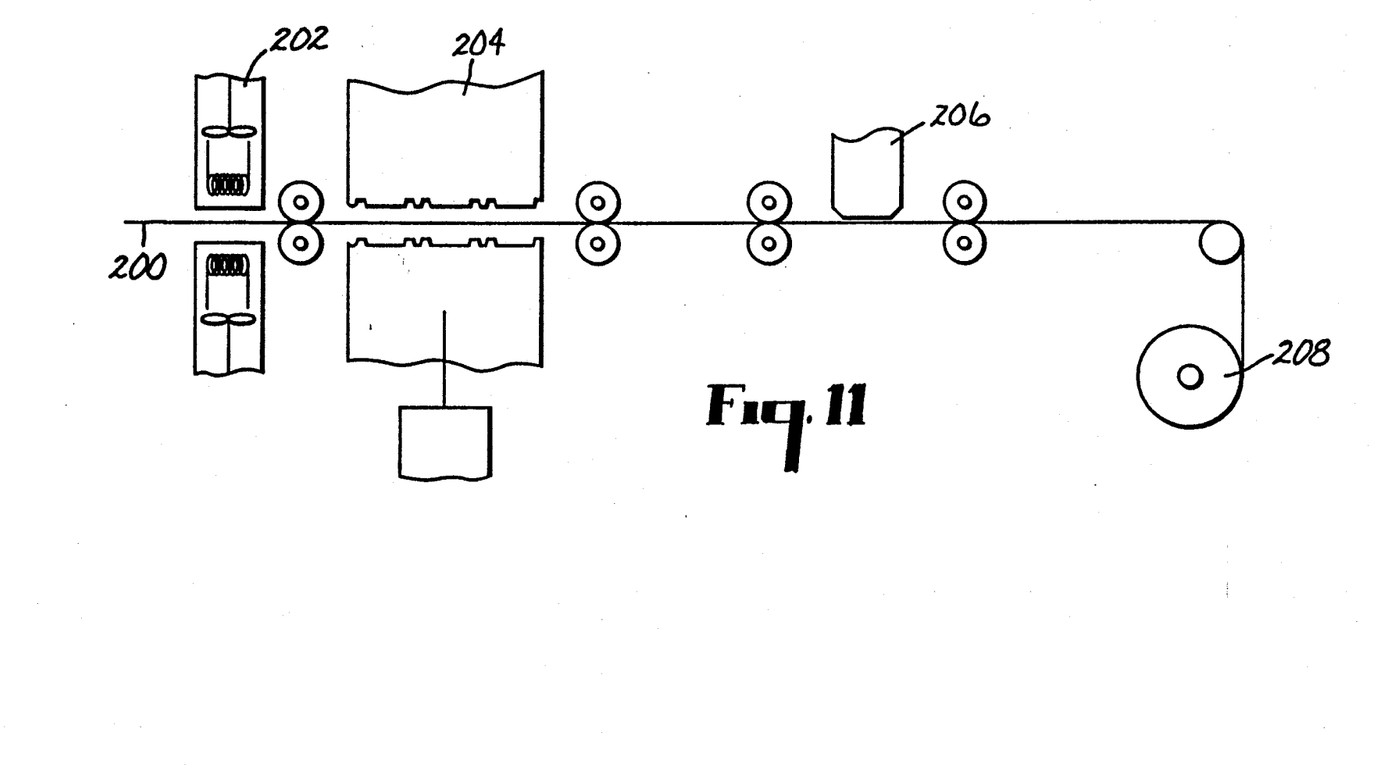
FIG. 11 is a schematic diagram of a method for producing the carrier tape of the present invention.

As further shown at 206 in FIG. 11, advancement holes and apertures are punched into the pockets, and any excess material, known as weed, is cut from the edges of the carrier tape to conform the carrier tape to industry standards. The finished carrier tape is wound onto a core 208 to form a supply roll for storage until the carrier tape is loaded with components. Alternatively the pockets of the carrier tape may be loaded with through-hole components immediately after the tape is formed, and the loaded tape rolled for immediate use during a circuit assembly operation. In the preferred embodiment, a cover strip (shown with respect to the prior art at 72 in FIG. 6) is placed over the top surface of the carrier tape and releasably bonded thereto to prevent contaminants from reaching the components. The cover strip must therefore be peeled away from the carrier tape in the manner earlier described before the contents may be removed.

The process described above may be practiced in a variety of ways, for example by using a modified version of a machine such as an ETM 320 or an ETF 278B embossing and taping mechanism available from AR-COTRONICS MECCANICA of Italy, or from Mechanization of Active and Passive Components (M.A.P.C.) of Occidental, Calif. Modifications of the described process are also possible, and incorporate manufacturing techniques are generally known in the art.

The present invention has now been described with reference to several embodiments thereof. It will be apparent to those skilled in the art that many changes can be made in the embodiments described without departing from the scope of the invention. For example, certain other articles having at least one pin member, such as lamps, light emitting diodes, male plug members or other products could be carried by the tape of the present invention. Thus, the scope of the present invention should not be limited by the structures described herein, but only by structures described by the language of the claims and the equivalents of those structures.

I claim:

1. A unitary flexible carrier tape for storage and seriatim delivery of electronic through-hole components by an advancement mechanism, each component having a body having a plurality of pins projecting from the body and arranged in two parallel rows, the carrier tape comprising:
   (a) a strip portion defining a top surface, said strip portion including laterally spaced, parallel rows of aligned holes formed in said top surface for engagement with the advancement mechanism;
   (b) a plurality of aligned pockets spaced along the carrier tape and opening through said top surface, said pockets each including
      (i) four side wall portions each at generally right angles with respect to each adjacent wall portion, said side wall portions adjoining and extending downwardly from said top surface of said strip portion, and
      (ii) a bottom wall portion adjoining said side wall portions to form the pocket, said bottom wall portion having
         (A) two parallel rows of aligned apertures formed therein and adapted for receipt of and engagement with each of the pins one of the components, said rows having at least as many apertures as the component has pins, and
         (B) two spaced rib portions formed in said bottom wall and projecting away from said strip portion for a distance greater than the length of the pins to protect the pins of the component.

2. The carrier tape of claim 1, wherein each pocket is adapted to carry more than one component therein.

3. The carrier tape of claim 1, wherein said plurality of pockets includes more than one aligned row of pockets opening through said top surface.

4. The carrier tape of claim 3, wherein said rows of pockets extend generally parallel to the longitudinal direction of the carrier tape.

5. The carrier tape of claim 1, wherein said apertures are adapted to receive post members projecting from the component.

6. The carrier tape of claim 1, and further including a cover strip releasably bonded to said top surface.

7. The carrier tape of claim 1, wherein said carrier tape is electrically dissipative.

8. The carrier tape of claim 1, and further including means for mechanically engaging the pins of the electronic components when the pins are disposed within said apertures.

9. A unitary flexible carrier tape for storage and seriatim delivery of electronic through-hole components by an advancement mechanism, each component having a body including a plurality of arranged pins projecting substantially downwardly from the body, the carrier tape comprising:
   (a) a strip portion defining a top surface, said strip portion including opposed, parallel rows of aligned holes formed therein for engagement with the advancement mechanism;
   (b) a plurality of aligned pockets spaced along the carrier tape and opening through said top surface, said pockets each including
      (i) at least one wall portion adjoining and extending downwardly from said top surface of said strip portion, and
      (ii) a bottom wall portion adjoining said side wall portion to form the pocket, said bottom wall portion having
         (A) a plurality of arranged apertures formed therein and adapted for receipt of each of the pins of the components, said bottom wall portion having at least as many apertures as the component has pins, and
         (B) at least one rib portion formed in said bottom wall and projecting away from said strip portion for a distance greater than the length of the pins to protect the pins of the component.

10. The carrier tape of claim 9, wherein each pocket is adapted to carry more than one component therein.

11. The carrier tape of claim 9, wherein said plurality of pockets includes more than one aligned row of pockets opening through said top surface.

12. The carrier tape of claim 9, wherein the pins of the component are arranged in two parallel rows.

13. The carrier tape of claim 9, wherein said apertures are adapted to receive post members projecting from the component.

14. The carrier tape of claim 9, and further including a cover strip releasably bonded to said top surface.

15. The carrier tape of claim 9, wherein said carrier tape is electrically dissipative.

16. The carrier tape of claim 9, and further including means for mechanically engaging the pins of the electronic components when the pins are disposed within said apertures.

17. A unitary flexible carrier tape adapted for advancement by a mechanism, the carrier tape comprising:
   (a) strip portion defining a top surface, said strip portion including opposed, parallel rows of aligned holes formed therein for engagement with the advancement mechanism;
   (b) a plurality of aligned pockets spaced along the carrier tape and opening through said top surface, said pockets each including
      (i) four side wall portions each at generally right angles with respect to each adjacent side wall portion, said side wall portions adjoining and extending downwardly from said top surface of said strip portion, and
      (ii) a bottom wall portion adjoining said side wall portions to form the pocket, said bottom wall portion having
         (A) a plurality of arranged apertures formed therein and adapted for receipt of and engagement with each of the pins of the components, said bottom wall portion having at least as many apertures as the component has pins, and
         (B) two spaced rib portions formed in said bottom wall and projecting away from said strip portion for a distance greater than the length of the pins to protect the pins of the component, and
   (c) a plurality of electronic through-hole components disposed within said pockets, each component having a body including a plurality of arranged pins projecting from the body, each of the pins having a downwardly extending terminal end, said components adapted for carriage within said pockets with said pins disposed within said apertures to form a loaded carrier tape and to enable delivery of said components by said loaded carrier tape as said loaded carrier tape is advanced by the mechanism.

18. The carrier tape of claim 17, wherein each pocket contains more than one through-hole component.

19. The carrier tape of claim 17, wherein said plurality of pockets includes more than one aligned row of pockets opening through said top surface.

20. The carrier tape of claim 17, wherein the pins of the component are arranged in two parallel rows.

21. The carrier tape of claim 17, wherein said apertures are adapted to receive post members projecting from the component.

22. The carrier tape of claim 17, and further including a cover strip releasably bonded to said top surface.

23. The carrier tape of claim 17, wherein said carrier tape is electrically dissipative.

24. The carrier tape of claim 17, and further including means for mechanically engaging the pins of the electronic components when the pins are disposed within said apertures.

25. A unitary flexible carrier tape adapted for advancement by a mechanism, the carrier tape comprising:
  (a) a strip portion defining a top surface, said strip portion including opposed, parallel rows of aligned holes formed therein for engagement with the advancement mechanism;
  (b) a plurality of aligned pockets spaced along the carrier tape and opening through said top surface, said pockets each including
    (i) four side wall portions each at generally right angles with respect to each adjacent side wall portion, said side wall portions adjoining and extending downwardly from said top surface of said strip portion, and
    (ii) a bottom wall portion adjoining said side wall portions to form the pocket, said bottom wall portion having
      (A) a plurality of arranged apertures formed therein and adapted for receipt of and engagement with each of the pins of the components, said bottom wall portion having at least as many apertures as the component has pins, and
      (B) two spaced rib portions formed in said bottom wall and projecting away from said strip portion for a distance greater than the length of the pins to protect the pins of the component,
  (c) a plurality of electronic through-hole components disposed within said pockets, each component having a body including a plurality of arranged pins projecting from the body, each of the pins having a downwardly extending terminal end, said components adapted for carriage within said pockets with said pins disposed within said apertures to form a loaded carrier tape and to enable delivery of said components by said loaded carrier tape as said loaded carrier tape is advanced by the mechanism; and
  (d) a core around which said loaded carrier tape is wound to form a supply roll.

26. The carrier tape of claim 25, wherein each pocket contains more than one through-hole component.

27. The carrier tape of claim 25, wherein said plurality of pockets includes more than one aligned row of pockets opening through said top surface.

28. The carrier tape of claim 25, wherein said apertures are adapted to receive post members projecting from the component.

29. The carrier tape of claim 25, and further including a cover strip releasably bonded to said top surface.

30. The carrier tape of claim 25, wherein said carrier tape is electrically dissipative.

* * * * *

UNITED STATES PATENT AND TRADEMARK OFFICE
CERTIFICATE OF CORRECTION

PATENT NO. : 5,199,564
DATED : April 6, 1993
INVENTOR(S) : Thomas Skrtic

It is certified that error appears in the above-indentified patent and that said Letters Patent is hereby corrected as shown below: On drawing sheet

Figure 6 should include a horizontal directional arrow 70 pointing to the left.

Figure 9, reference numeral "100" should read --100'--.

Signed and Sealed this

Eighteenth Day of October, 1994

Attest:

BRUCE LEHMAN

*Attesting Officer*   *Commissioner of Patents and Trademarks*